Sept. 23, 1958 W. S. GEISLER, JR 2,853,646

ELECTRON DISCHARGE DEVICE

Filed June 7, 1954

INVENTOR.
Wilson S. Geisler, Jr.
BY Paul B. Fike
Patent Agent

United States Patent Office 2,853,646

Patented Sept. 23, 1958

2,853,646

ELECTRON DISCHARGE DEVICE

Wilson S. Geisler, Jr., Atherton, Calif.

Application June 7, 1954, Serial No. 434,717

4 Claims. (Cl. 315—5.21)

Figures 1, 2:
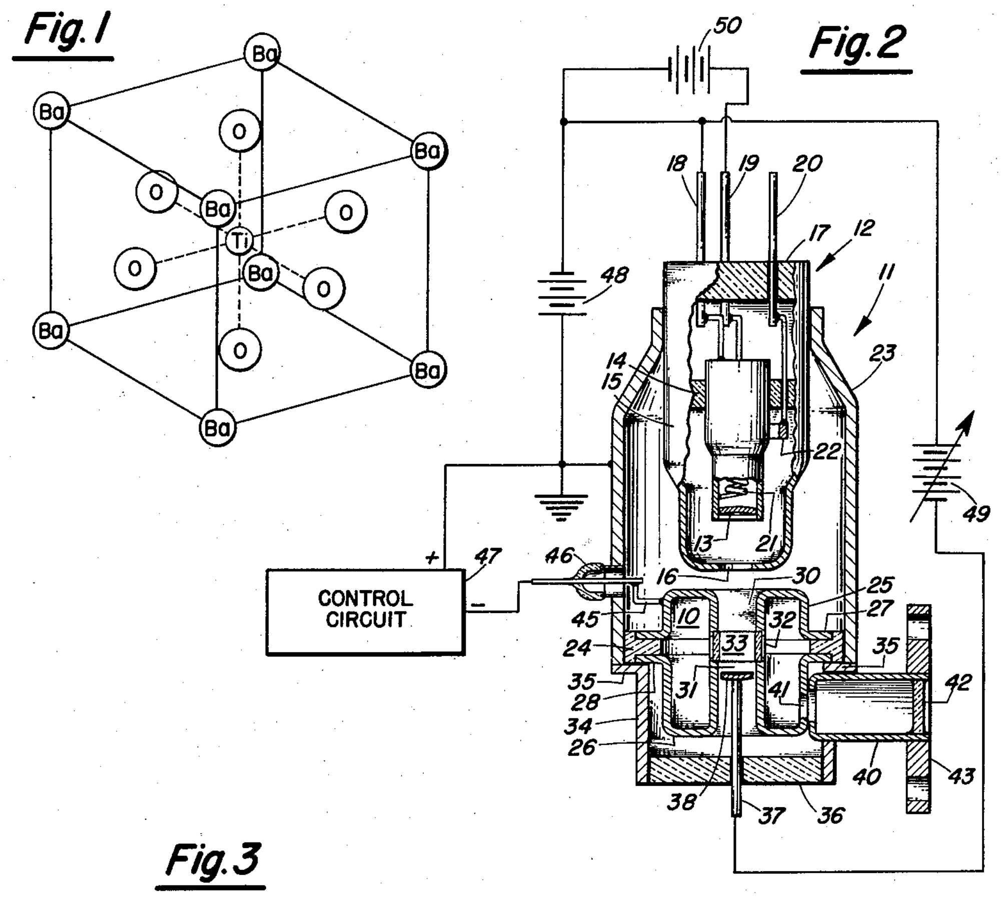

The present invention relates to electron discharge devices of the velocity modulation type, operable at microwave frequencies and more particularly, to arrangements for tuning such devices over a relatively wide frequency range.

No more serious problem has arisen in the field of electronics than the provision of an arrangement or mechanism for tuning relatively high frequency electron discharge devices, such as klystrons. At low frequencies, for example, in the radio broadcast band, tuning is accomplished readily. Usually, for example, a low frequency oscillator is tuned by varying the capacity of a variable condenser in an external tank circuit. A single variable condenser having a plurality of plates can enable tuning over the entire radio broadcast band.

When klystrons having internal resonant cavities were developed prior to World War II, attempts were begun and have continued to provide a similar mechanical arrangement for tuning these devices. However, since the frequency determining elements, that is, the capacitance and the inductance in a klystron are determined by the geometry of the resonant cavity or cavities and such cavities form a portion of the body or vacuum envelope of the device, an inherent physical limitation is placed upon the tuning range in these internal cavity klystrons.

Whereas the earliest attempts at mechanical tuning constituted merely a mechanical deformation of the cavity to thereby vary its inductance and/or capacitance values, later, other mechanical expedients such as a flexible diaphragm embodied as part of the cavity wall, as well as physically movable tuning slugs adapted to enter the cavity in varying degrees were employed to circumvent the inherent limitation. While these expedients permitted a slight increase in the tuning range, additional problems with regard to maintaining the vacuum seal for the klystrons were encountered. That is, repeated flexure of a diaphragm or displacement of a tuning slug and the attached bellows or other flexible element needed for sealing the slug to the stationary portion of the klystron, ultimately cause mechanical fracture and consequent leakage of air into the vacuum envelope.

An additional attempt was made in the direction of providing a resonant cavity positioned in whole or in part exteriorally of the vacuum envelope so that the described leakage difficulties might be overcome. This, however, gave rise to an additional problem with respect to the coupling of energy from the electron beam within the vacuum envelope to the exteriorally disposed cavity, which has lead, in most instances, to the production of undesired modes of operation, thereby necessitating the incorporation of relatively complex mode-suppressing arrangements.

Most recently, in view of the described difficulties with respect to the mechanical tuning of klystrons, attempts have been made to provide other electron discharge devices such as the backward wave oscillator which is theoretically tunable by the mere variation of an applied voltage over a relatively wide band. As a practical matter, backward wave oscillators, at the present time, have not proven themselves, for although they are voltage-tunable, other requirements such as a high gain characteristic have not been achieved.

Accordingly, it is an object of the present invention to provide electron discharge devices of the velocity-modulation type which are free from the mentioned disadvantages of present devices and are tunable over a wide frequency range.

A feature of the invention involves the provision in electron discharge devices operable at microwave frequencies of an arrangement for varying the operating frequency of such devices in response to variation of an applied D. C. voltage.

Another feature is the provision of an improved method and means for compensating automatically for frequency drift of an electron discharge device of the type referred to.

A further feature involves the provision of an electron discharge device incorporating the tuning arrangement referred to, which is particularly easy to construct.

Figure 3:
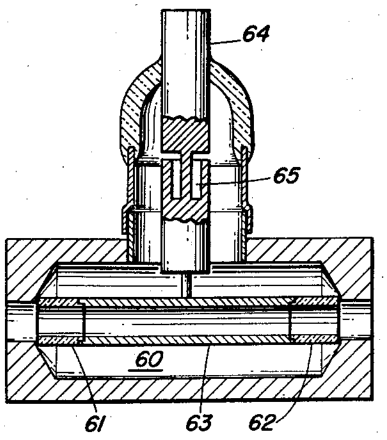

These, as well as additional features of the invention will become more apparent from the following description of the accompanying drawing, wherein:

Figure 1 is a diagrammatic perspective view of the crystal lattice structure of a substance which may be employed in carrying out the present invention, Figure 2 is a central sectional view through a velocity modulation to be embodying the invention, the associated circuitry being diagrammatically indicated, and Figure 3 is a central sectional view of the resonant cavity portion of another type of velocity modulation device or tube embodying the invention.

It is known that a certain class of dielectric materials, which shall hereinafter be referred to as "electrites," exhibit among other properties, that of a change of dielectric constant upon variation of an applied electric field. It will be understood that the term "electrites" is chosen to refer to these voltage-sensitive dielectrics by analogy to the term "ferrites," applied to certain materials which exhibit changed properties upon variation of an applied magnetic field.

While the precise mechanism which results in the mentioned change in the dielectric constants of these materials is not yet entirely understood, it is sufficient for present purposes merely to state that upon the application of an electric field to one of these materials, the charged particles in the crystal lattice thereof are somewhat displaced so that although the chemical composition remains the same with no change in total electric charge, the actual physical disposition of the atoms in the crystals are varied slightly but sufficiently to produce a polarization and the resultant variation in the dielectric constant.

In Figure 1 is shown diagrammatically, the crystal lattice of one of these materials, barium titanate, which exhibits a continuously varying dielectric constant resulting from a determining, continuous change in an applied electric field. In the case of barium titanate, presumably the central titanium atom is shifted upon application of the electric field to produce the mentioned polarization. For a further and more detailed explanation of the mechanism, reference is made to the book entitled "Ferroelectricity" by E. T. Jaynes, published by the Princeton University Press in 1953.

In accordance with the present invention, one of the described class of "electrites," which includes Rochelle salt and potassium dihydrogen phosphate, as well as barium titanate, is disposed within the capacitive cap in a velocity modulation device so that a variable electric field can be applied. When the field varies to change the dielectric constant of the material, the capacitance value at the gap and consequently the frequency of the device is changed. Thus a voltage-tunable electron discharge device is provided.

Barium titanate has certain additional properties which make it particularly advantageous for utilization in the present invention. Barium titanate is a ceramic material so that it will withstand readily the high operating temperatures which may be encountered in velocity modulation tubes and also may readily be physically secured within such tubes by known metal-to-ceramic sealing techniques. Furthermore, the dielectric constant of barium titanate is temperature as well as voltage dependent, thus enabling the material to be employed as a "sensing element" for purposes of compensation against frequency drift, as will be explained hereinafter.

Among the properties of barium titanate is the existence of a piezoelectric effect which while present predominantly at low frequencies, that is, in the neighborhood of 200 kilocycles, is also present at microwave frequencies so as to constitute a cause for radio frequency losses. Thus, for example, if pure barium titanate were placed within a resonant cavity, a lowering of the cavity "Q" might result. In order that this deleterious result may be alleviated, it has been determined that an intimate mixture of strontium titanate with the barium titanate will in effect deaden the piezoelectric effect and accordingly, reduce such losses so that a high "Q" in a resonant cavity can be maintained. The addition of the strontium titanate also lowers the curie point of the electrite so that it is well below the operating temperature of any electron discharge device.

As shown in Figure 2, an electrite whose composition is 75 percent barium titanate and 25 percent strontium titanate is, in accordance with the present invention, incorporated in the resonator cavity 10 of a velocity modulation tube 11 to provide for tuning thereof. This tube 11 is generally similar in both structure and operation to a conventional reflex klystron and includes an electron gun 12 having a cathode 13 physically secured within an annular ceramic disc 14 which is in turn secured at its periphery to the interior of a cup-shaped anode 15. When so secured, a central opening 16 in the bottom of the cup-shaped anode 15 is adjacent and axially aligned with the cathode 13. The electron gun 12 is completed by a ceramic disc 17 sealed within the extremity of the described anode 15 and having suitable leads 18, 19, 20 extending therethrough in vacuum-tight sealing relation to enable application of voltage to the described cathode 13 and a suitable heater 21 and getter 22. When assembled, the electron gun 12 is inserted and secured within a hollow, cylindrical copper shell forming a section 23 of the tube body.

The resonator cavity 10, constructed in accordance with the present invention, is secured within the end of the described cylindrical body section 23 so as to be axially aligned with the cathode 13 and the central opening 16 in the mentioned anode 15. For this purpose, an annular insulator 24, preferably constructed of ceramic and substantially T-shaped in cross section, is secured with its head portion in vacuum sealing relation within the cylindrical body section 23 so that the base of the T extends inwardly. The resonator cavity 10 is defined by two copper sections 25, 26 which have lateral flanges 27, 28 that are secured to the upper and lower surfaces of the insulator 24 so that the sections are electrically isolated, one from the other, with respect to D. C. voltage. The cavity sections 25, 26 are, however, electrically coupled at the operating frequency of the tube by the lateral flanges 27, 28, each of which is dimensioned to be one-half wave length at the middle operating frequency of the tube 11. As a result, although D. C. isolation is provided, the cavity wall appears continuous to the radio frequency wave. The upper cavity section 25, as shown in Figure 2, is of shallow, annular, trough-like configuration so that a small reentrant drift space 30 is centrally defined, such drift space being aligned axially with the cathode 13 and anode opening 16. The lower section 26 of the resonator cavity 10 is of generally similar configuration, but somewhat greater in depth. The interior wall thereof, which defines a second aligned drift space 31, terminates at a pre-determined distance from the reentrant wall of the first cavity section 25 to thus define therebetween a capacitive gap 32. Within this gap, a tubular member 33 of the previously mentioned electrite is secured by known ceramic-to-metal sealing techniques which briefly involve first the application of a molybdenum-manganese coating to the ends of the ceramic electrite member 33 and the subsequent brazing of the coated member to the extremities of the interior walls of the cavity 10.

To complete the tube, a second body section 34 in the form of a copper cylindrical shell is secured by brazing an annular flange 35 formed at one end thereof both to the first body section 23 and to the flange 28 on the second section 26 of the resonator cavity 10. A ceramic disc 36 is secured within the interior of this second body section 34 and centrally supports in vacuum-tight relation, a metal stem 37 which extends therethrough to mount a reflector 38 within the reentrant portion of the second cavity section 26 and displaced a pre-determined distance from the described capacitive gap 32.

To provide for egress of the radio frequencies energy from the resonator cavity 10, a wave guide stub 40 is adapted to sealingly encompass an opening or iris 41 formed in the exterior wall of the second cavity section 26 and to extend outwardly therefrom through the lower body section 34 to which the stub 40 is secured in vacuum-tight relation by brazing. A mica window 42 is sealed within a wave guide flange 43 at the end of the described wave guide stub 40 to maintain the vacuum within the tube body.

As will be apparent from the foregoing structural description, the wave guide stub 40 and the second cavity section 26, as well as the anode 15 are all in direct electrical contact with the cylindrical sections 23, 34, forming the body of the tube, whereas the cathode 13 and associated heater 21 and getter 22, as well as the reflector 38 and the first or upper section 25 of the cavity 10 are held insulated from the body. The first cavity section 25 is connected by a wire 45 passing through a suitable vacuum seal 46 in the tube body to the negative side of a control circuit 47 including a variable source of D. C. potential whose positive side is maintained at ground potential, which also constitutes the body potential of the tube and consequently, also the potential of the second section 26 of the resonator cavity 10. A battery 48 is connected to the cathode lead 18 in the ceramic base 17 of the tube so that the cathode 13 will be maintained at a desired negative potential with respect to the anode 15 which, being connected to the tube body, is at ground potential. A second battery 49, whose potential can be varied, is connected between the cathode 13 and the reflector stem 37 so that the latter can be maintained at a potential approximately equal to or in some instances, somewhat more negative than the cathode and a third battery 50 supplies the needed voltage for the heater 21 in the tube.

When the described potentials have been applied to the various elements of the tube, electrons will be emitted from the cathode 13 to be accelerated by the anode 15 to pass thereafter across the capacitive gap 32 until they approach the reflector 38. Since the reflector 38 is maintained at a negative potential, the electrons upon their approach will be repelled and thus forced to return across the capacitive gap 32 to thereafter be collected for the most part on the walls of the positively biased anode 15. Depending upon the geometry and potentials applied to the tube, the electrons will be velocity modulated on their initial passage across the capacitive gap 32 and their return, after being repelled by the reflector 38, will be timed so that their second crossing of the gap will be made at a point of maximum bunching to thereby result in radio frequency oscillation within the cavity 10 of a determined frequency. The described action of the electrons within the tube and the resultant setting up of radio frequency oscillations will be recognized as generally similar to that action in a conventional reflex klystron and the energy may be extracted from the cavity through the described iris 41 and wave guide stub 40.

When, during operation, control circuit 47 is adjusted to change the D. C. voltage applied to the first section 25 of the resonator cavity 10, the electric field through the barium titanate member 33 in the capacitive gap 32 of the cavity is varied to thereby effect a change in the dielectric constant of the barium titanate in the manner previously described so as to produce a change in the capacitance value across the gap. Since the capacitance changes as a result of such voltage variation, the frequency of oscillation of the tube must also change and depending upon the direction and amount of voltage change, a corresponding change in the frequency of the tube output will be effected. If the voltage across the barium titanate is varied a considerable amount, it may be necessary to adjust the negative potential on the reflector 38 to reestablish the proper time for transit of the electrons between their first and second crossings of the capacitive gap 32. This adjustment then will assure that maximum bunching of the electrons is obtained so that the amplitude of the radio frequency output of the oscillator can at any frequency be optimized.

Since the first cavity section 25 is negative with respect to both the cup-shaped anode 15 and the second cavity section 26, any positive ions will be drained from the drift-space 30 to thereby lower the noise level during operation of the tube. Thus, this first cavity section 25 is not only an element in the tuning arrangement, but also, in effect, simultaneously functions as an ion-draining electrode.

The control circuit 47 enabling variation of the D. C. voltage applied across the capacitive gap 32 is arranged, in accordance with the present invention, to provide for automatic compensation of this voltage so that the output frequency of the tube will not drift with a change in an operating parameter such as the tube temperature. This arrangement constitutes, in its details, no part of the present invention and can take many forms such as, for example, a conventional bridge circuit, one leg of which constitutes the variable capacitive gap 32 of the tube. Consequently, if the temperature of the tube varies for any reason, the temperature of the barium titanate will also vary, which results in a change in the capacitance across the gap, since as has been previously indicated, the crystal lattice structure of barium titanate is temperature sensitive. When the capacitance value changes, the bridge circuit will become unbalanced to resultantly effect a change in the D. C. voltage applied across the gap to reestablish the initial capacitance value and consequently, the desired frequency of the tube. In this manner, the problem of temperature compensation in tubes such as klystrons, is simply circumvented.

It will be appreciated from the foregoing, that an electrite such as barium titanate can be applied not only to a tube operating generally in a similar manner to the conventional reflex klystron to both enable voltage tuning and temperature compensation thereof, but can more generally be applied to any electron discharge device having a capacitive gap within which the electrite may be positioned and across which a variable D. C. bias may be applied. Thus, the tuning arrangement might well be applied to backward wave oscillators, magnetrons and traveling wave tubes, as well as a wide variety of klystron type tubes.

As an example, in Figure 3 is illustrated the cavity portion 60 of a floating drift tube klystron. Small tubular electrite members 61, 62 are secured within each of the capacitive gaps formed at the ends of the floating drift tube 63 in the cavity 60 and a combination lead and support 64 for the floating drift tube 63 extends through the cavity wall to enable the application of a variable D. C. voltage to the floating drift tube. A suitable radio frequency choke 65 is embodied in this lead to preclude the egress of radio frequency energy. Since the same D. C. bias is applied across both gaps in the cavity 60 and the same electrite material is positioned therein, the capacitive values of the two gaps will undergo correlative variations upon any change in the D. C. voltage level.

Various modifications and alterations, other than those specifically mentioned, may be made without departing from the spirit of the invention. Consequently, the foregoing description and the accompanying drawings are to be considered as purely exemplary and not in a limiting sense; and reference is made to the appended claims which are indicative of the scope of the invention.

What is claimed is:

1. In a floating drift tube klystron wherein a beam of electrons is produced, a structure adapted to propagate radio frequency energy in interacting relation with the beam of electrons in the device, said structure including a cavity portion and a drift tube insulated from one another with respect to direct-current voltage and defining a capacitive gap between each end of said drift tube and said cavity portion, an electrite disposed in each of said capacitive gaps, a variable source of direct-current voltage, and means for connecting said source between said drift tube and said cavity portion whereby the capacitive values across both of said gaps can be simultaneously varied.

2. An electron discharge device comprising an electron gun adapted to produce a beam of electrons, a resonator cavity aligned with said gun and adapted to velocity modulate the electrons in said beam, said resonator cavity being defined by a pair of metal sections insulated one from the other with respect to direct-current voltage but having spaced flange portions arranged so that said sections are coupled with respect to the operating frequency of the device, an electrite within said cavity, and means for applying direct-current voltage between said sections to create an electric field across said electrite.

3. An electron discharge device comprising an electron gun adapted to produce a beam of electrons and including an electron accelerating anode, a resonator cavity aligned with said gun and adapted to velocity modulate the electrons in the beam, said resonator cavity being defined by first and second metal sections spaced in the direction of electron motion so as to be insulated with respect to direct-current voltage, said second section being spaced farthest from said accelerating anode and electrically connected thereto, means for applying a direct-current voltage between said cavity-defining sections so that said first section is negative relative to said second section, and an electrite disposed in said cavity so as to experience an electric field thereacross upon application of the direct-current voltage between said sections.

4. An electron discharge device comprising an electron gun adapted to produce a beam of electrons, a resonator cavity aligned with said electron gun so as to velocity modulate the electrons in said beam, said cavity being defined by a pair of metal sections insulated one from the other with respect to direct-current voltage, an electrite in said cavity, means for applying a variable direct-current voltage between said sections so as to vary the dielectric constant of said electrite, a reflector having a negative voltage adapted to repel the electrons so as to effect a return passage thereof through said cavity, and means for varying the negative voltage on said reflector.

References Cited in the file of this patent

UNITED STATES PATENTS

| | | |
|---|---|---|
| 2,287,845 | Varian et al. | June 30, 1942 |
| 2,293,151 | Linder | Aug. 18, 1942 |
| 2,314,794 | Linder | Mar. 23, 1943 |
| 2,333,295 | Chevigny | Nov. 2, 1943 |
| 2,374,810 | Fremlin | May 1, 1945 |
| 2,752,495 | Kroger | June 26, 1956 |

OTHER REFERENCES

Article by Coursey and Brand, "Nature," vol. 157, 1946, pp. 297–9.